United States Patent
Cho et al.

(10) Patent No.: US 7,595,783 B2
(45) Date of Patent: Sep. 29, 2009

(54) SHIFT REGISTER

(75) Inventors: Nam Wook Cho, Gunpo-si (KR); Soo Young Yoon, Goyong-si (KR); Min Doo Chun, Seoul (KR)

(73) Assignee: LG. Display Co., Ltd., Seoul (KR)

( * ) Notice: Subject to any disclaimer, the term of this patent is extended or adjusted under 35 U.S.C. 154(b) by 679 days.

(21) Appl. No.: 11/295,976

(22) Filed: Dec. 6, 2005

(65) Prior Publication Data
US 2006/0145999 A1    Jul. 6, 2006

(30) Foreign Application Priority Data
Dec. 31, 2004    (KR) .................. 10-2004-0118606

(51) Int. Cl.
G09G 3/36    (2006.01)

(52) U.S. Cl. ..................................... 345/100

(58) Field of Classification Search ............. 345/100; 377/64
See application file for complete search history.

(56) References Cited

U.S. PATENT DOCUMENTS

| | | | | |
|---|---|---|---|---|
| 5,859,630 A * | 1/1999 | Huq | .......................... | 345/100 |
| 2003/0231735 A1 * | 12/2003 | Moon et al. | .................... | 377/64 |
| 2004/0109526 A1 * | 6/2004 | Park et al. | ..................... | 377/64 |

* cited by examiner

Primary Examiner—Richard Hjerpe
Assistant Examiner—Carolyn R Edwards
(74) Attorney, Agent, or Firm—Brinks Hofer Gilson & Lione

(57) ABSTRACT

A shift register for use with a liquid crystal display device includes a plurality of stages. A stage of the shift register includes a first controller, a second controller and an output buffer. The first controller charges and discharges a first node. The second controller charges and discharges a second node and a third node. The output buffer outputs a first output signal in response to the state of the first node and a second output signal in response to the state of the second and third nodes. The shift register may be adaptive to avoid a malfunction caused by a gate bias stress.

25 Claims, 6 Drawing Sheets

SHIFT REGISTER

This application claims the benefit of the Korean Patent Application No. P2004-118606 filed on Dec. 31, 2004, which is hereby incorporated by reference by its entirety.

BACKGROUND

1. Technical Field

The present invention relates to a drive circuit of a liquid crystal display device, and more particularly to a drive circuit having a shift register using an amorphous silicon (a-Si) thin film transistor.

2. Related Art

A liquid crystal display (LCD) is a display device for use with a television or a computer. The LCD controls light transmittance of a liquid crystal using an electric field to display a picture. To this end, the LCD includes a liquid crystal display panel having liquid crystal cells arranged in a matrix type and a drive circuit for driving the liquid crystal display panel.

The liquid crystal display panel includes a liquid crystal cell formed at each area which is defined by intersecting gate lines and data lines. A thin film transistor (hereinafter, referred to as "TFT") is connected between a gate line and a data line and a pixel electrode is included in the liquid crystal cell. The TFT supplies a data signal from the data line to the pixel electrode in response to a scan signal from the gate line. The liquid crystal cell controls a light transmittance by having liquid crystal molecules with dielectric anisotropy rotate in accordance with a voltage difference between the pixel electrode and a common electrode. As a result, gray levels may be displayed.

The drive circuit includes a gate driver for driving the gate lines, and a data driver for driving the data lines. The gate driver sequentially supplies the scan signal to the gate lines. The data driver converts a digital data into an analog data signal to supply the analog data signal to the data line whenever the scan signal is supplied. The gate driver includes a shift register for sequentially generating the scan signal. The data driver also includes a shift register for generating sequential sampling signals which make the data signal from the outside sampled sequentially.

Figure 1:
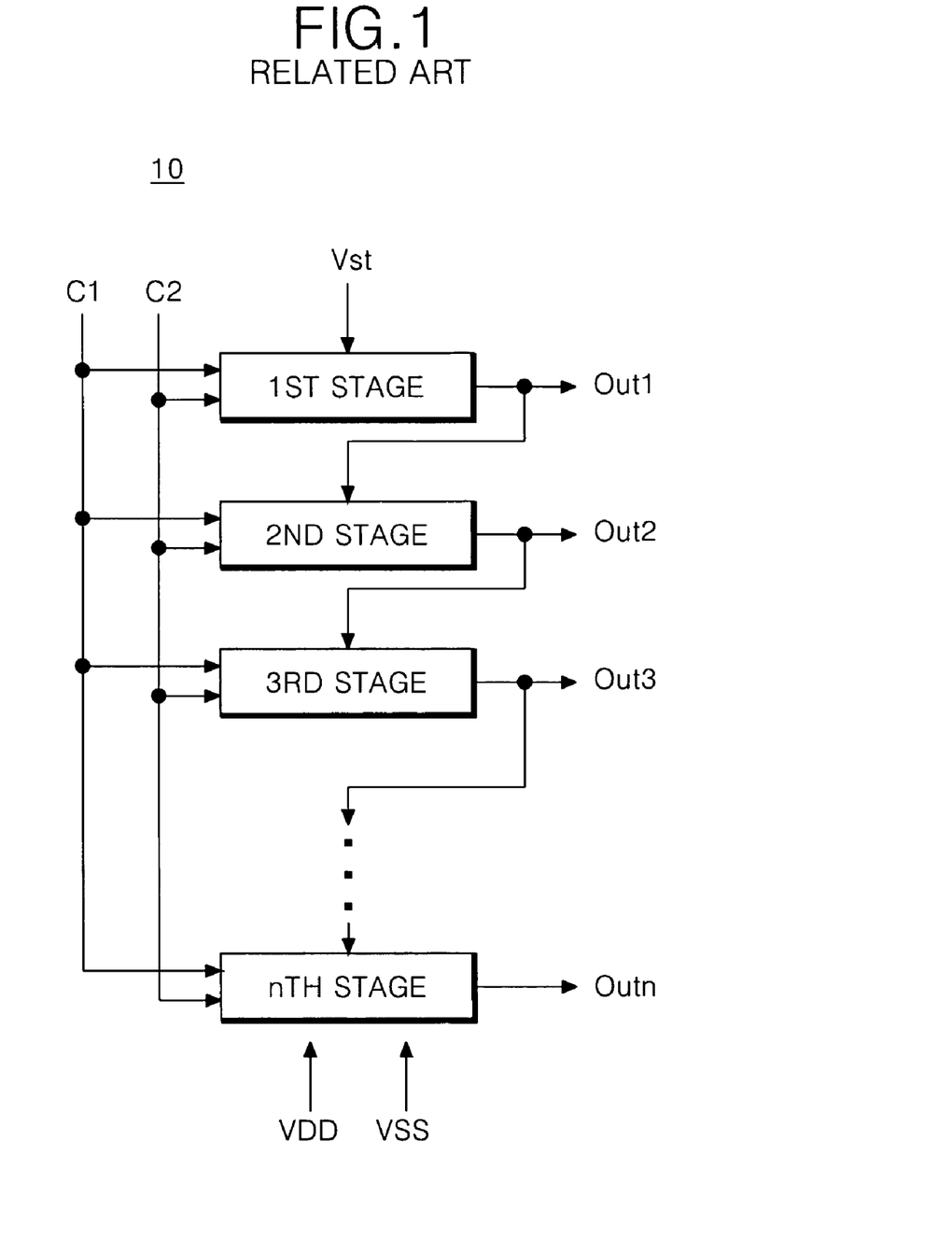
FIG. 1 is a block diagram illustrating a shift register of the related art.

FIG. 1 illustrates a shift register 10 of the related art which includes $1^{st}$ to $n^{th}$ stages that are connected in cascade to a start pulse Vst input line. The $1^{st}$ to $n^{th}$ stages of the shift register shown in FIG. 1 are commonly supplied with first and second clock signals C1, C2 along with high-level and low-level driving voltages VDD, VSS. The $1^{st}$ to $n^{th}$ stages of the shift register 10 are supplied with the start pulse Vst and an output signal of the previous stage. The $1^{st}$ stage outputs a first output signal Out1 in response to the start pulse Vst and the first and second clock signals C1, C2. The $2^{nd}$ to $n^{th}$ stages output $2^{nd}$ to $n^{th}$ output signals in response to the output signal of the previous stage and the first and second clock signals C1, C2, respectively. The $1^{st}$ to $n^{th}$ stages may have an identical circuit configuration and sequentially shift the start pulse Vst to output it in response to the first and second clock signals C1, C2. For use with a gate driver, the $1^{st}$ to $n^{th}$ output signals Out1 to Outn from the $1^{st}$ to $n^{th}$ stages are supplied as the scan signal for sequentially driving the gate lines of the liquid crystal display panel. Alternatively, for use with a data driver, the $1^{st}$ to $n^{th}$ output signals Out1 to Outn may be supplied as the sampling signal for sequentially sampling a video signal within the data driver.

Figure 2:
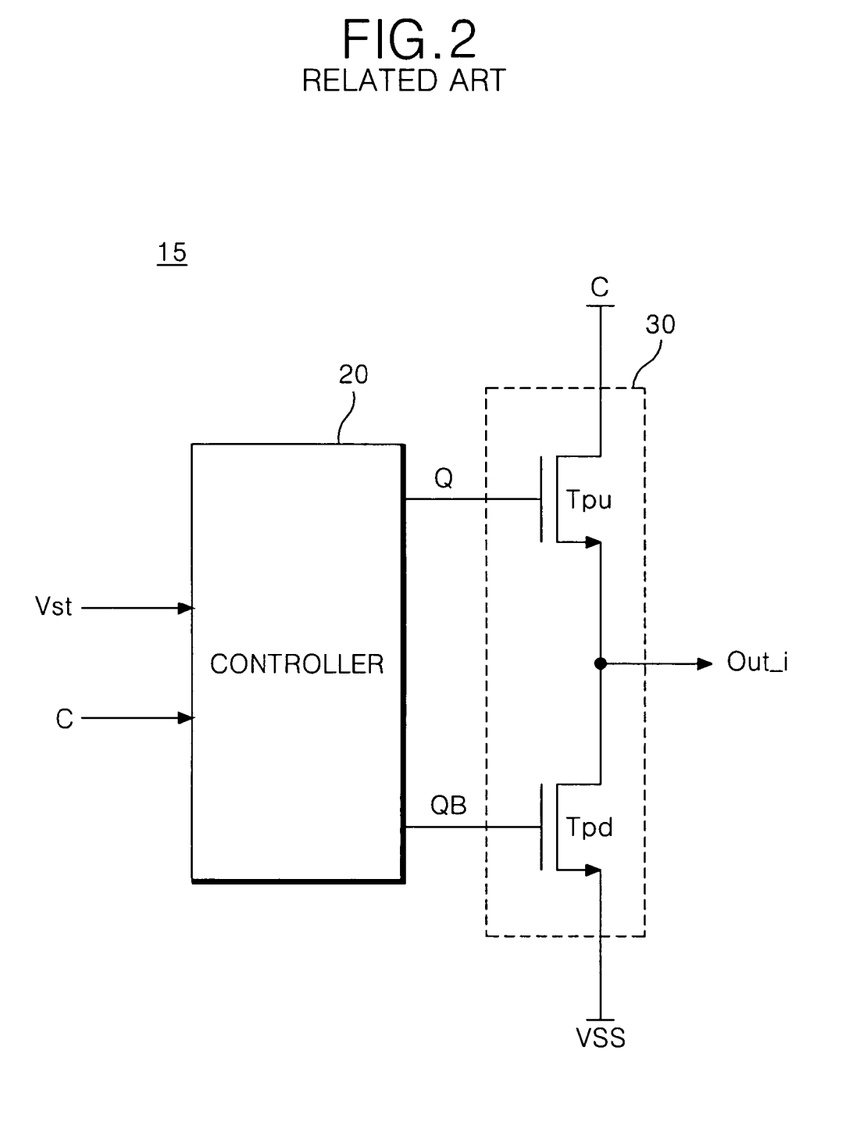
FIG. 2 is a circuit diagram illustrating one of stages shown in FIG. 1.

FIG. 2 is a circuit diagram illustrating configuration of one of the stages shown in FIG. 1. The stage 15 shown in FIG. 2 includes an output buffer part 30 having a pull-up TFT Tpu which outputs a clock signal C to an output line under control of a Q node. The output buffer part 30 further includes a pull-down TFT Tpd which outputs the low-level driving voltage VSS to the output line under control of a QB node. The stage also includes a controller 20 for controlling the Q node and the QB node.

The controller 20 charges the Q node with the output signal of the previous stage, i.e., start pulse Vst, to make the pull-up TFT Tpu output a high-state voltage of the clock signal C as an output signal Out_i. Additionally, the controller 20 discharges the Q node and charges the QB node by the clock signal C to make the pull-down TFT Tpd output the low-level voltage VSS as the output signal Out_i. The pull-down TFT Tpd is turned off when the pull-up TFT Tpu is turned on. As a result, the low-level voltage VSS is output as the output signal Out_i. To this end, the QB node may remain in a high state for the period that the pull-down TFT Tpd is on by the controller 10. During this time, the pull-down TFT Tpd may experience malfunctions because it may be subject to excessive gate bias stress. As a result, a threshold voltage Vth of the pull-down TFT Tpd may be changed.

SUMMARY

By way of example only, in one embodiment, a shift register for use with a liquid crystal display device includes a plurality of stages. A stage of the shift register includes a first controller, a second controller and an output buffer. The first controller charges and discharges a first node. The second controller charges and discharges a second node and a third node. The output buffer outputs a first output signal in response to the state of the first node and a second output signal in response to the state of the second and third nodes.

In another embodiment, a shift register includes first and second AC voltage supply lines and first and second DC voltage supply lines. The first and second AC voltage supply lines supply first and second AC voltages having opposite polarities in first and second frames. The first and second DC voltage supply lines supply first and second DC voltages, respectively. The shift register further includes at least two clock signal supply lines, a pull-up TFT, and first and second pull-down TFTs. The two clock signal supply lines supply at least two clock signals having different phases. The pull-up TFT is controlled in response to the state of a first node to supply any one of the clock signals to an output line. The first and second pull-down TFTs are respectively controlled in response to the state of second and third nodes such that the second DC voltage is alternately supplied to the output line in the first and second frames. A first node controller operates to pre-charge and discharge the first node, and second and third node chargers operate to alternately charge the second and third nodes with the first DC voltage in the first and second frames under control of any one clock signal of the clock signals and the first and second AC voltages. Second and third node dischargers operate to alternately discharge the second and third nodes in the first and second frames.

In further another embodiment, a method for driving an output buffer of a shift register having a plurality of stages is provided. In the method, a first pull-down TFT is activated in a first frame and a second pull-down TFT is deactivated in the first frame. A second pull-down TFT is activated in a second frame and the first pull-down TFT is deactivated in the second frame. A pull-up TFT is deactivated when one of the first and second pull-down TFTs is activated.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments, examples of which are illustrated in the accompanying drawings. Hereinafter, the preferred embodiments will be described in detail with reference to FIGS. 3 to 6.

Figure 3:
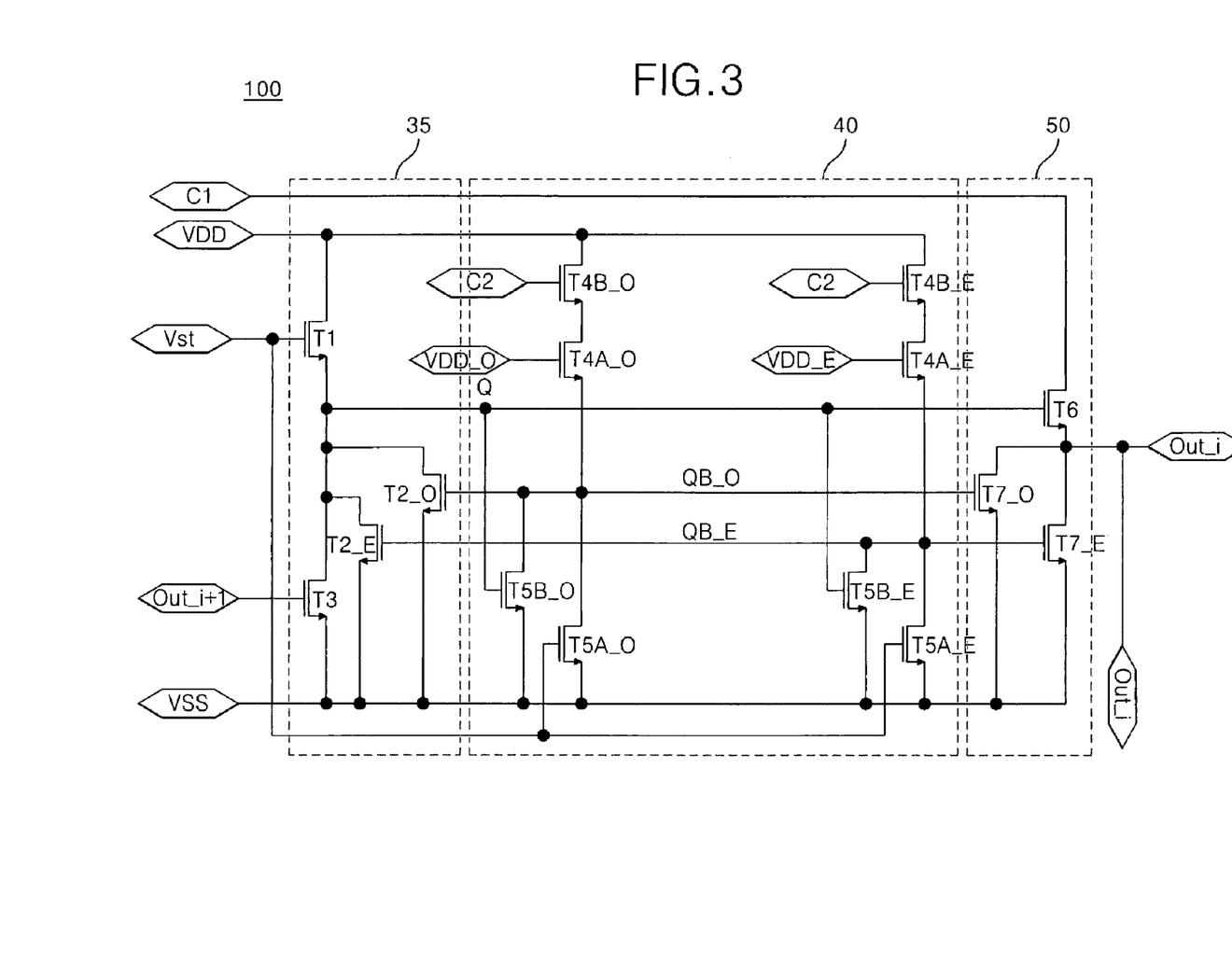
FIG. 3 is a circuit diagram of one of stages in a shift register according to a first embodiment.
Figure 4:
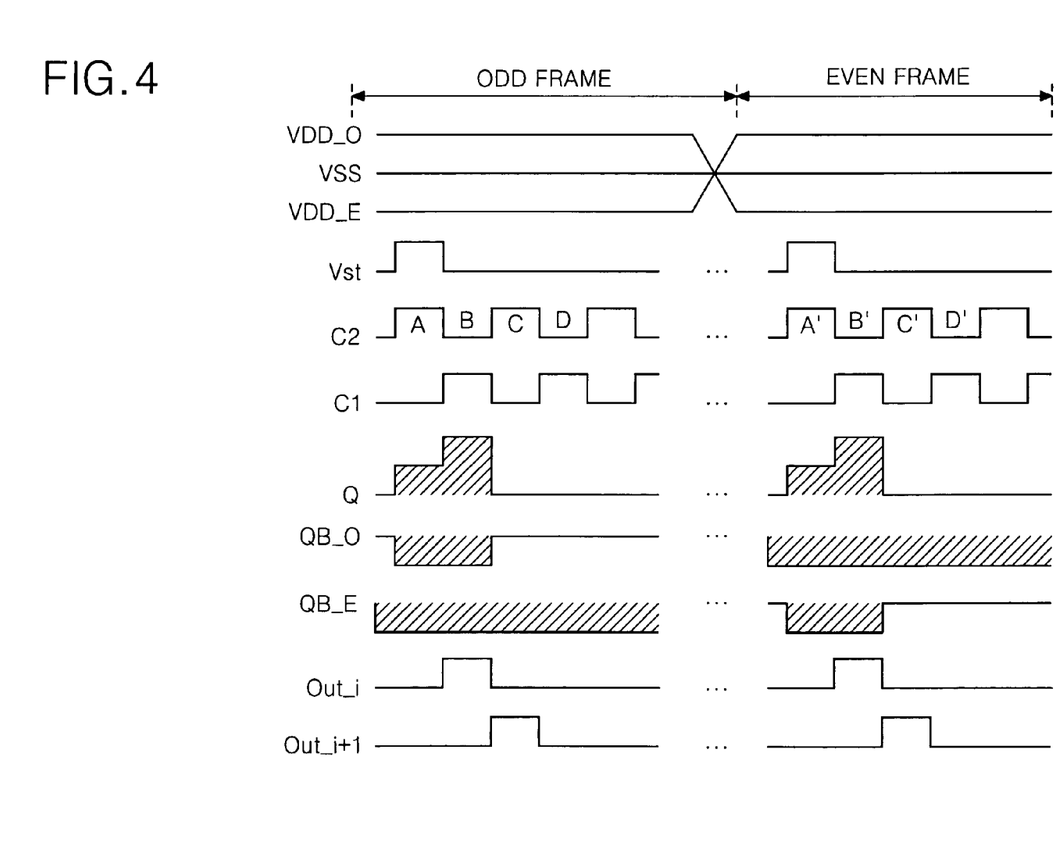
FIG. 4 is a driving waveform diagram of the shift register shown in FIG. 3.

FIG. 3 illustrates a circuit diagram of one of a plurality of stages connected in cascade a shift register according to a first embodiment, and FIG. 4 illustrates a driving waveform diagram for use with the stage shown in FIG. 3. The stage 100 of the shift register shown in FIG. 3 includes a first controller 35, a second controller 40 and an output buffer 50. The first controller 35 and the second controller 40 may control the output buffer 50 to output different output signals. For example, the first controller 35 and the second controller 40 may activate or deactivate thin film transistors (TFTs) of the output buffer 50. The first controller 35 and the second controller 40 may include TFTs that are activated or deactivated in response to various control signals.

The output buffer 50 includes a pull-up TFT T6 for outputting a first clock signal C1 to an output line in response to the state of a Q node. The output buffer 50 also includes odd and even pull-down TFTs T7_O, T7_E for outputting a low-level voltage VSS to the output line under control of QB_O and QB_E nodes. The first controller 35 has first to third TFTs T1, T2_O, T2_E, T3 for charging and discharging the Q node. The second controller 40 has two pairs of odd TFTs and two pairs of even TFTs. A first pair of odd TFTs includes TFTs T4A_O, T4B_O for alternately charging the QB_O node in odd and even frames, and a second pair of odd TFTs includes T5A_O, T5B_O for alternately discharging QB_O. A first pair of even TFTs includes even TFTs T4A_E, T4B_E for alternately charging QB_E node in even frames, and a second pair of even TFTs includes even T5A_E, T5B_E for discharging QB_E in even frames.

In the stage 100, TFTs of the same type may be used for all TFTs. In this embodiment, the TFTs employ NMOS TFTs. Alternatively, PMOS TFTs may be used for the TFTs. A first TFT T1 of the first controller 35 pre-charges the Q node under control of the start pulse Vst. The second odd and even TFTs T2_O, T2_E discharge the Q node under control of the QB_O and QB_E nodes, respectively. The third TFT T3 discharges the Q node under control of an output voltage OUT_i+1 of the next stage.

The second controller 40 includes a second clock signal C2 and first and second alternating current (hereinafter, referred to as "AC") voltages VDD_O and VDD_E. The first pair of the odd TFTs T4A_O, T4B_O charges the QB_O node and the first pair of the even TFTs T4A_E, T4B_E charges the QB_E node under control of first and second alternating current (hereinafter, referred to as "AC") voltages VDD_O and VDD_E, respectively. The second pair of the odd TFTs T5A_O, T5B_O and the second pair of the even TFT's T5A_E, T5B_E discharge the QB_O and QB_E nodes under control of the start pulse Vst and the Q node, respectively.

FIG. 4 illustrates a driving waveform diagram of the stage 100 of the shift register of FIG. 3. As shown in FIGS. 3 and 4, the odd pull-down TFT T7_O is driven under control of the QB_O node in an odd frame when the first AC voltage VDD_O is in a high state, and the even pull-down TFT T7_E is driven under control of the QB_E node in an even frame when the second AC voltage VDD_E is in a high state. The odd and even pull-down TFTs T7_O, T7_E are alternately driven in the odd and even frames in this manner, so that it may minimize a stress caused by a direct current (hereinafter, referred to as "DC") bias.

The phase-inverted first and second clock signals C1, C2 are provided to the stage of FIG. 3. Each stage is further supplied with the high-level voltage VDD, the low-level voltage VSS and the first and second AC voltages VDD_O and VDD_E having the polarities that are inverted to be opposite to each other in the odd and even frames.

The operation of the shift register is described with reference to FIGS. 3 and 4. Firstly, in the odd frame interval, the first AC voltage VDD_O becomes the high state and the second AC voltage VDD_E becomes a low state. In an "A" period of the odd frame (see clocks signals C1 and C2), a low-state voltage of the first clock signal C1, a high-state voltage of the second clock signal C2 and a high-state voltage of the start pulse Vst are supplied. The first TFT T1 of FIG. 3 is activated or turned on by the high-state voltage of the start pulse Vst to pre-charge the Q node with the high-level voltage VDD. Accordingly, the pull-up TFT T6 is turned on to supply the low-state voltage of the first clock signal C1 as an output signal OUT_i. At this moment, the odd TFTs T4A_O, T4B_O are turned on by the second clock signal C2 and the first AC voltage VDD_O of the high state. The odd TFT's T5A_O, T5B_O is also turned on by the high-state voltage of the Q node and the start pulse Vst; thus the QB_O node becomes the low state by the low-level voltage VSS. Further, the even TFT T4B_E is turned on by the second clock signal C2, and the even TFT T4A_E is deactivated or turned off by the second AC voltage VDD_E of the low state. The even TFTs T5A_E, T5B_E are turned on by the high-state voltage of the Q node and the state pulse Vst; thus, the QB_E node becomes the low state by the low-level voltage VSS. Accordingly, the odd and even pull-down TFTs T7_O, T7_E are turned off by the QB_O and QB_E nodes having the low state.

In a "B" period, a high-state voltage of the first clock signal C1, a low-state voltage of the second clock signal C2 and a low-state voltage of the start pulse Vst are supplied. The first TFT T1 is turned off by the low-state voltage of the start pulse Vst and the third TFT T3 is turned off by a low-state voltage of the next stage output signal OUT_i+1, thereby having the Q node floating in a high state. The Q node floating in the high state is bootstrapped in response to the high-state voltage of the first clock signal C1. The first clock signal C1 may be subject to a coupling action of the parasitic capacitor formed by an overlap between the gate electrode and the source electrode of the pull-up TFT T6. Accordingly, voltage at the Q node further increases to turn on the pull-up TFT T6, thereby supplying the high-state voltage of the first clock signal C1 as an output signal OUT_i. To enhance the bootstrapping effect at the Q node, an additional capacitor may be provided in parallel to the parasitic capacitor.

In the "B" period, the odd TFT T4A_O is turned on by the first AC voltage VDD_O of the high state, and the odd TFT T4B_O is turned off by the second clock signal C2 of the low state. The odd TFT T5B_O is turned on by the high-state voltage of the bootstrapped Q node; thus the QB_O node becomes the low state by the low-level voltage VSS. Further, the even TFT T5B_E is turned on by the high-state voltage of the Q node, and QB_E node remains in the low state. Accordingly, the odd and even pull-down TFT's T7_O, T7_E are turned off.

In a "C" period, a low-state voltage of the first clock signal C1, a high-state voltage of the second clock signal C2 and a low-state voltage of the start pulse Vst are supplied. The first TFT T1 is turned off by the low-state voltage of the start pulse Vst and the third TFT T3 is turned on by a high-state voltage of the next stage output signal OUT_i+1 to supply the low-level voltage VSS to the Q node; thus the pull-up TFT T6 is turned off. At this moment, the odd TFT's T5A_O, T5B_O and the even TFT's T5A_E, T5B_E are all turned off by the low-state voltage of the Q node and the start pulse Vst. The odd TFT's T4A_O, T4B_O, however, are turned on by the second clock signal C2 and the first AC voltage VDD_O of the high state, thereby supplying the high-level voltage VDD to the QB_O node. Accordingly, the odd pull-down TFT T7_O is turned on to supply the low-level voltage VSS as the output signal Out_i. The second odd TFT T2_O is turned on by the high state of the QB_O node: thus the Q node is fixed in the low state. The even TFT T4A_E is turned off by the second AC voltage VDD_E of the low-state voltage to make the QB_E node remain in the low state; thus the even pull-down TFT T7_E remains turned off.

In a "D" period, a high-state voltage of the first clock signal C1, a low-state voltage of the second clock signal C2 and a low-state voltage of the start pulse Vst are supplied. The first and third TFTs T1 and T3 are turned off by the low-state voltages of the start pulse Vst and the next stage output signal OUT_i+1, so that the Q node keeps the previous low state. Accordingly, the odd TFTs T5A_O, T5B_O and the even TFT's T5A_E, T5B_E are all turned off by the low-state voltage of the Q node and the start pulse Vst. The odd TFT T4A_O is turned on by the first AC voltage VDD_O of the high state and the odd TFT T4B_O is turned off by the second clock signal C2: thus the QB_O node is floating to keep the previous high state. The odd pull-down TFT T7_O is turned on to supply the low-level voltage VSS as the output signal Out_i. The second odd TFT T2_O is turned on by the high state of the QB_O node; thus the Q node is fixed in the low state. At this moment, the even TFTs T4A_E, T4B_E are turned off to make the QB_E node remain in the previous low state; thus the even pull-down TFT T7_E is turned off. In the remaining period of the odd frame, the C and D periods may be repeated such that the odd pull-down TFT T7_O remains turned on and the output signal Out_i of the stage remains in the low state.

In an even frame period, the first AC voltage VDD_O becomes the low state and the second AC voltage VDD_E becomes the high state. In an "A'" period of the even frame, a low-state voltage of the first clock signal C1, a high-state voltage of the second clock signal C2 and a high-state voltage of the start pulse Vst are supplied. The first TFT T1 is turned on by the high-state voltage of the start pulse Vst to pre-charge the Q node with the high-level voltage VDD. Accordingly, the pull-up TFT T6 is turned on to supply the low-state voltage of the first clock signal C1 as an output signal OUT_i. At this moment, the even TFTs T4A_E, T4B_E are turned on by the second clock signal C2 and the second AC voltage VDD_E of the high state. The even TFTs T5A_E, T5B_E are also turned on by the high-state voltage of the Q node and the start pulse Vst; thus the QB_E node becomes the low state by the low-level voltage VSS. Further, the odd TFT T4B_O is turned on by the second clock signal C2, and the odd TFT T4A_O is turned off by the second AC voltage VDD_O of the low state. The odd TFTs T5A_O, T5B_O are turned on by the high-state voltage of the Q node and the start pulse Vst: thus, the QB_O node becomes the low state by the low-level voltage VSS. Accordingly, the odd and even pull-down TFTs T7_O, T7_E are turned off.

In a "B'" period, a high-state voltage of the first clock signal C1, a low-state voltage of the second clock signal C2 and a low-state voltage of the start pulse Vst are supplied. The first TFT T1 is turned off by the low-state voltage of the start pulse Vst and the third TFT T3 is turned off by a low-state voltage of the next stage output signal OUT_i+1, thereby having the Q node floating in a high state. The Q node floating in a high state is bootstrapped in response to the high-state voltage of the first clock signal C1 by the parasitic capacitor of the pull-up TFT T6. Accordingly, a voltage at the Q node increases such that the pull-up TFT T6 must be turned on, thereby supplying the high-state voltage of the first clock signal C1 as an output signal OUT_i. To enhance the bootstrapping effect at the Q node, an additional capacitor may be provided in parallel to the parasitic capacitor.

In the "B'" period, the even TFT T4A_E is turned on by the second AC voltage VDD_E of the high state, and the even TFT T4B_E is turned off by the second clock signal C2 of the low state. The even TFT T5B_E is turned on by the high-state voltage of the bootstrapped Q node: thus the QB_E node becomes the low state by the low-level voltage VSS. Further, the odd TFT T5B_O is turned on by the high-state voltage of the Q node: thus QB_O node remains in the low state. Accordingly, the odd and even pull-down TFT's T7_O, T7_E are turned off.

In a "C'" period, a low-state voltage of the first clock signal C1, a high-state voltage of the second clock signal C2 and a low-state voltage of the start pulse Vst are supplied. The first TFT T1 is turned off by the low-state voltage of the start pulse Vst and the third TFT T3 is turned on by a high-state voltage of the next stage output signal OUT_i+1 to supply the low-level voltage VSS to the Q node: thus the pull-up TFT T6 is turned off. The odd TFT's T5A_O, T5B_O and the even TFT's T5A_E, T5B_E are all turned off by the low-state voltage of the Q node and the start pulse Vst. The high-level voltage VDD is supplied to the QB_E node through the even TFT's T4A_E, T4B_E which are turned on by the second clock signal C2 and the second AC voltage VDD_E of the high state. Accordingly, the even pull-down TFT T7_E is turned on to supply the low-level voltage VSS as the output signal Out_i. The second even TFT T2_E is turned on by the high state of the QB_E node: thus the Q node is fixed in the low state. The odd TFT T4A_O is turned off by the first AC voltage VDD_O of the low-state voltage to make the QB_O node remain in the low state. The odd pull-down TFT T7_O is turned off.

In a "D'" period, a high-state voltage of the first clock signal C1, a low-state voltage of the second clock signal C2 and a low-state voltage of the start pulse Vst are supplied. The first and third TFTs T1 and T3 are turned off by the low-state voltages of the start pulse Vst and the next stage output signal OUT_i+1, so that the Q node keeps the previous low state. Accordingly, the odd TFTs T5A_O, T5B_O and the even TFT's T5A_E, T5B_E are all turned off by the low-state voltage of the Q node and the start pulse Vst. At this moment, the even TFT T4A_E is turned on by the second AC voltage VDD_E of the high state and the even TFT T4B_E is turned off by the second clock signal C2. Thus, the QB_E node is floated to keep the previous high state. Accordingly, the even pull-down TFT T7_E is turned on to supply the low-level voltage VSS as the output signal Out_i. The second even TFT T2_E is turned on by the high state of the QB_E node, and the Q node is fixed in the low state. At this moment, the even TFTs T4A_O, T4B_O are turned off to make the QB_O node remain in the previous low state, and the odd pull-down TFT T7_O is turned off. In the remaining period of the even frame, the C' and D' periods are repeated such that the even pull-down TFT T7_E remains to be turned on and the output signal Out_i of the stage remains in the low state.

In this way, the shift register according to the first embodiment alternately drives the dual pull-down TFT T7_O, T7_E in the odd frame and the even frame. As a result, the gate bias stress may be prevented. Further, the odd TFT's T4A_O, T4B_O charging the QB_O node and the even TFT's T4A_E, T4B_E charging the QB_E node are alternately driven in the odd frame and the even frame. It is possible to restrain the gate bias stress.

The low-state voltage may be supplied to all of the gate, source, drain electrodes of the odd TFT T4A_O, or the even T4A_E which is turned off in the resting frame. Alternatively, the high-state voltage may be provided on the source electrode by the odd TFT T4B_O, or the even T4B_E which is turned on by the second clock signal C2. This becomes a condition of low bias stress. Further, the high-state voltage is supplied on the drain electrode in case that the odd or even TFT T4B_O, T4B_E is also turned off by the second clock signal C2, or the same high-state voltage is provided on the gate, source, drain electrode in case of being turned on by the second clock signal C2. This becomes a condition of low bias stress. As a result, a high bias stress is restrained, thereby improving the lifespan of the panel.

Figure 5:
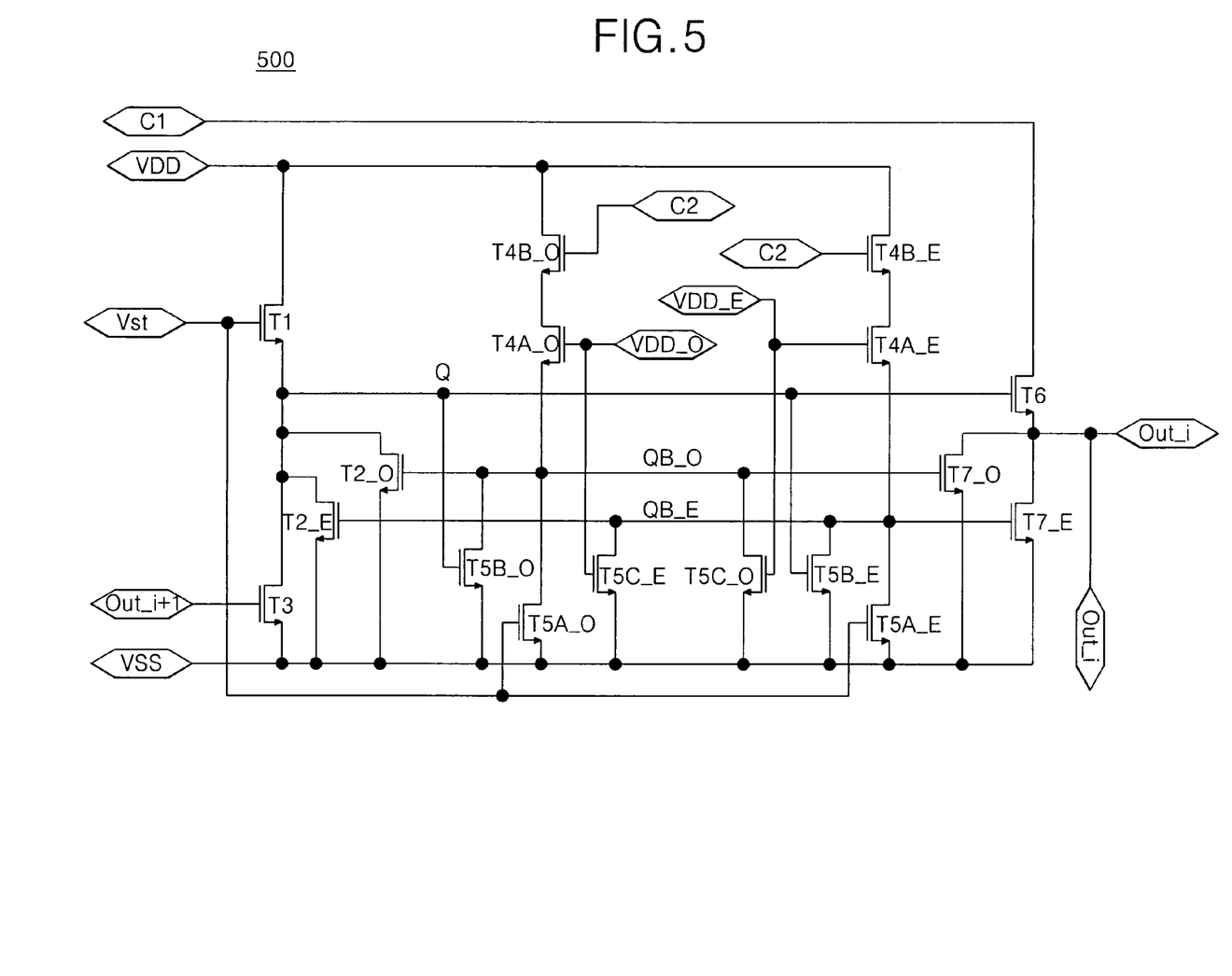
FIG. 5 is a circuit diagram of one of stages in a shift register according to a second embodiment.

FIG. 5 illustrates a circuit diagram of one of stages connected in cascade in a shift register according to a second embodiment. The stage 500 includes the same components as the stage 100 shown in FIG. 3 and further includes an even TFT T5C_E and an odd TFT T5C_O. The even TFT T5C_E discharges the QB_E node by the first AC voltage VDD_O and the odd TFT T5C_O discharges the QB_O node by the second AC voltage VDD_E.

The even TFT T5C_E, as shown in FIG. 5, is turned on to supply the low-level voltage VSS to the QB_E node if the first AC voltage VDD_O becomes the high state in the odd frame. The odd TFT T5C_O is turned on to supply the low-level voltage VSS to the QB_O node if the second AC voltage VDD_E becomes the high state in the even frame. In other words, the even TFT T5C_E changes the high-state voltage of the QB_E node to the low-state voltage by applying the low state voltage in the odd frame. The odd TFT T5C_O changes the high-state voltage of the QB_O node to the low-state voltage by applying the low-state voltage in the even frame.

Figure 6:
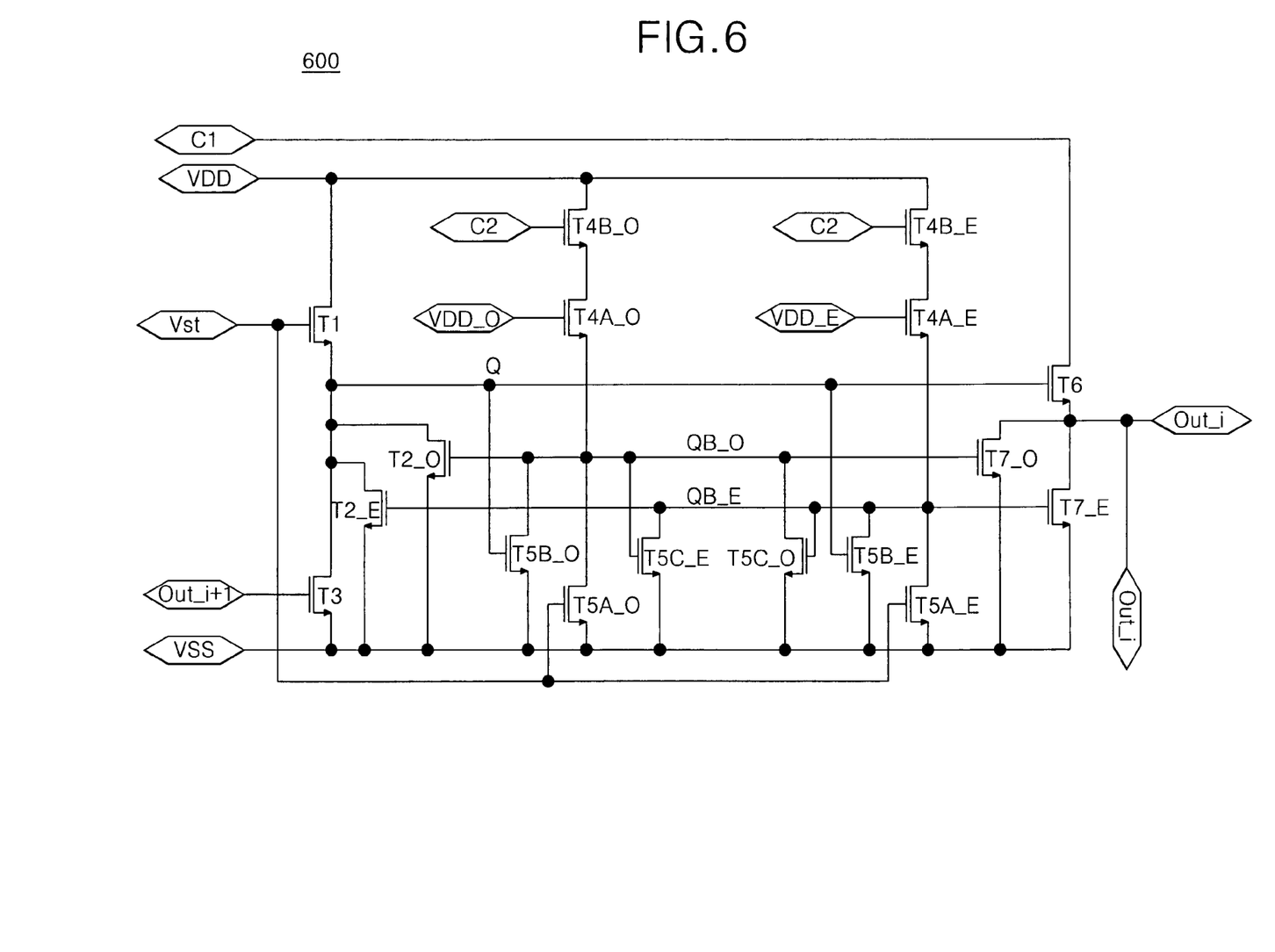
FIG. 6 is a circuit diagram of one of stages in a shift register according to a third embodiment.

FIG. 6 illustrates a circuit diagram of one of stages 600 in a shift register according to a third embodiment. Unlike the stage 500 of FIG. 5, the even TFT T5C_E is controlled by the QB_O node and the odd TFT T5C_O is controlled by the QB_E node in FIG. 6. Referring to FIG. 4, the even TFT T5C_E shown in FIG. 6 is turned on by the QB_O node which becomes the high state after a high output voltage Out_i is supplied in the odd frame. The QB_E node remains the low-level voltage VSS. The odd TFT T5C_O is turned on to keep the QB_O node at the low-level voltage VSS if the QB_E node become the high state in the even frame.

As described above, the shift register may drive the dual pull-down TFT T7_O, T7_E alternately in the odd frame and the even frame. As a result, the gate bias stress may be prevented. Also, the shift register drives the TFTs T4A_O, T4B_O charging the QB_O node and the TFTs T4A_E, T4B_E charging the QB_E node alternately in the odd frame and the even frame. It is possible to restrain the gate bias stress. Further, in the shift register, the condition of low bias stress may be provided in the frame when the TFTs T4A_O, T4B_O and the TFTs T4A_E, T4B_E take a rest. Because the high bias stress may be restrained, the lifespan of the liquid crystal display panel may improve. As a result, the shift register may avoid the circuit malfunction caused by the gate bias stress even in the case of using the amorphous silicon (a-Si) TFT.

In the embodiment described above, a shift register for use with a liquid crystal display device includes a plurality of stages. A stage of the shift register includes a first controller, a second controller and an output buffer. The first controller charges and discharges a first node. The second controller charges and discharges a second node and a third node. The output buffer outputs a first output signal in response to the state of the first node and a second output signal in response to the state of the second and third nodes.

The first controller includes a first TFT, a second TFT and a third TFT. The first TFT is activated in response to a start pulse, and the second TFT includes a pair of TFTs that are alternately activated in response to the state of the second node and the third node. The third TFT is activated in response to an output signal of a next stage of the shift register. The first TFT is coupled to the output buffer at the first node, and the second TFT and the third TFT are coupled to the output buffer at the second and third nodes, respectively. The output buffer comprises a pull-up transistor that outputs the first output signal and a pair of pull-down transistors that output the second output signal alternately. One of the pair of the pull-down transistors is controlled to be activated in response to the state of the second node and the other pull-down transistor is controlled to be activated in response to the state of the third node. The pair of pull-down transistors may not be activated simultaneously. The second node remains a low state during a frame that the other pull-down transistor is activated and the third node remains a low state during a frame that the one pull-down transistor is activated.

The second controller comprises a first charger that charges the second node and a first discharger that discharges the second node. The first charger includes a first pair of TFTs that are connected in series and the first pair of TFTs are activated in response to a first clock signal and a first AC voltage. The first discharger includes a second pair of TFTs that are connected in parallel and the second pair of TFTs are activated in response to the first node and a low-level DC voltage.

The second controller further includes a second charger that charges the third node and a second discharger that discharges the third node. The second controller is coupled to the first controller and the output butter at the first, second and third nodes. The second charger includes a third pair of TFTs that are connected in series and the third pair of TFTs are activated in response to the first clock signal and a second AC voltage. The second discharger includes a fourth pair of TFTs that are connected in parallel and the fourth pair of TFTs are activated in response to the first node and the low-level DC voltage. The second controller further includes a sixth TFT connected to the third node and activated in response to the first AC voltage and a seventh TFT connected to the second node and activated in response to the second AC voltage. Alternatively, the second controller includes a sixth TFT connected to the third node and activated by the second node, and a seventh TFT connected to the second node and activated by the third node.

The first controller, the second controller and the output buffer comprise a plurality of TFTs of the same channel type. In one embodiment, the plurality of TFTs includes NMOS TFTs. In other embodiment, the plurality of TFTs is amorphous silicon TFTs.

In another embodiment, a method for driving an output buffer of a shift register having a plurality of stages is provided. In the method, a first pull-down TFT is activated in a first frame and a second pull-down TFT is deactivated in the first frame. A second pull-down TFT is activated in a second frame and the first pull-down TFT is deactivated in the second frame. A pull-up TFT is deactivated when one of the first and second pull-down TFTs is activated.

The pull-up TFT is activated in response to the state of a first node. Activation of the pull-up TFT includes deactivation of the first and second pull-down TFTs. Activation of the first pull-down TFT includes activating the first pull-down TFT in response to the state of a second node. Activation of the second pull-down TFT includes activating the second pull-down TFT in response to the state of a third node. A high state may be applied to the second node and a low state may be maintained at the third node. Alternatively, a high state may be applied to the third node and a low state may be maintained at the second node. Further alternatively, a high state may be applied to the first node and a low state is maintained at the second and third nodes.

Although embodiments are explained with reference to the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A shift register for use with a liquid crystal display device, a stage of the shift register comprising:
    a first controller that charges and discharges a first node;
    a second controller that charges and discharges a second node and a third node;
    an output buffer that outputs a first output signal in response to the state of the first node and a second output signal in response to the state of the second and third nodes,
    wherein the second controller charges the second node in response to a clock signal and a first AC voltage, and charges the third node activated in response to said clock signal and a second AC voltage, the second and third nodes alternately being activated.

2. The shift register of claim 1, wherein the first controller comprises:
    a first thin film transistor ("TFT") activated in response to a start pulse;
    a second TFT including a pair of TFTs that are alternately being activated in response to the state of the second node and the third node; and
    a third TFT activated in response to an output signal of a next stage of the shift register;
    wherein the first TFT is coupled to the output buffer at the first node, and the pair of TFTs of the second TFT are coupled to the output buffer at the second and third nodes, respectively.

3. The shift register of claim 1, wherein the output buffer comprises:
    a pull-up transistor that outputs the first output signal; and
    a pair of pull-down transistors that output the second output signal alternately,
    wherein one pull-down transistor is controlled to be activated in response to the state of the second node and the other pull-down transistor is controlled to be activated in response to the state of the third node,
    wherein the pair of pull-down transistors are not activated simultaneously.

4. The shift register of claim 3, wherein the second node remains a low state during a frame that the other pull-down transistor is activated and the third node remains a low state during a frame that the one pull-down transistor is activated.

5. The shift register of claim 1, wherein the second controller comprises a first charger that charges the second node, a first discharger that discharges the second node, a second charger that charges the second node and a second discharger that discharges the third node,
    wherein the second controller is coupled to the first controller and the output butter at the first, second and third nodes.

6. The shift register of claim 5, wherein the first charger comprises a first pair of TFTs that are connected in series and the first pair of TFTs are activated in response to said clock signal and the first AC voltage.

7. The shift register of claim 6, wherein the first discharger comprises a second pair of TFTs that are connected in parallel and the second pair of TFTs are activated in response to the state of the first node and a start pulse.

8. The shift register of claim 7, wherein the second charger comprises a third pair of TFTs that are connected in series and the third pair of TFTs are activated in response to said clock signal and the second AC voltage.

9. The shift register of claim 8, wherein the second discharger comprises a fourth pair of TFTs that are connected in parallel and the fourth pair of TFTs are activated in response to the state of the first node and the start pulse.

10. The shift register of claim 9, wherein the second controller further comprises a sixth TFT connected to the third node and activated in response to the first AC voltage and a seventh TFT connected to the second node and activated in response to the second AC voltage.

11. The shift register of claim 9, wherein the second controller further comprises a sixth TFT connected to the third node and activated by a state of the second node, and a seventh TFT connected to the second node and activated by a state of the third node.

12. The shift register of claim 1, wherein the first controller, the second controller and the output buffer comprise a plurality of TFTs of the same channel type.

13. The shift register of claim 12, wherein the plurality of TFTs comprise NMOS TFTs.

14. The shift register of claim 12, wherein the first controller, the second controller and the output buffer comprise a plurality of TFTs that are amorphous silicon TFTs.

15. A shift register having a plurality of stages that shifts a start pulse to supply the shifted start pulse as each output signal and a start pulse of a next stage, a stage of the shift register comprising:

first and second AC voltage supply lines for supplying first and second AC voltages having opposite polarities in first and second frames;

first and second DC voltage supply lines for supplying first and second DC voltages, respectively;

at least two clock signal supply lines for supplying at least two clock signals having different phases;

a pull-up thin film transistor controlled in response to the state of a first node to supply one of the clock signals to an output line;

first and second pull-down thin film transistors respectively controlled in response to the state of second and third nodes to alternately supply the second DC voltage to the output line in the first and second frames;

a first node controller for pre-charging and discharging the first node;

a second and third node charger for alternately charging the second and third nodes with the first DC voltage in the first and second frames under control of one of the clock signals and the first and second AC voltages; and a second and third node discharger for alternately discharging the second and third nodes in the first and second frames.

16. The shift register of claim 15, wherein the second and third node charger comprises:

a first pair of TFTs connected in series between the first DC voltage supply line and the second node and controlled by the first AC voltage and the clock signal, respectively; and, a second pair of TFTs connected in series between the first DC voltage supply line and the third node and controlled by the second AC voltage and the clock signal, respectively.

17. The shift register of claim 16, wherein one of the first pair of TFTs is activated by the clock signal and the one TFT includes the same voltage at gate, source and drain electrodes thereof upon activation in a frame when the second node is charged.

18. The shift register of claim 17, wherein the one TFT includes a voltage at a gate electrode lower than a voltage at one of the source and drain electrodes upon deactivation, and the source and drain electrodes are connected to the first DC voltage supply line.

19. The shift register of claim 16, wherein one of the second pair of TFTs is activated by the clock signal and the one TFT includes the same voltage at gate, source and drain electrodes thereof upon activation in a frame when the third node is charged.

20. The shift register of claim 19, wherein the one TFT includes a voltage at a gate electrode lower than a voltage at one of the source and drain electrodes upon deactivation, and the source and drain electrodes are connected to the first DC voltage supply line.

21. The shift register of claim 15, wherein the at least two clock signal supply lines supply the phase inverted first and second clock signals to the pull-up TFT and the second and third node chargers, the first and second clock signals having an inverted phase.

22. A method for driving an output buffer of a shift register having a plurality of stages, comprising:

activating a first pull-down TFT in a first frame and deactivating a second pull-down TFT in the first frame;

activating a second pull-down TFT in a second frame and deactivating the first pull-down TFT in the second frame; and deactivating a pull-up TFT when one of the first and second pull-down TFTs is activated in response to the state of a first node, wherein the first pull-down TFT is activated in response to the state of a second node and the a second pull-down TFT is activated in response to the state of a third node, wherein the second node is activated in response to a clock signal and a first AC voltage and the third node is activated in response to said clock signal and a second AC voltage, the second and third nodes alternately being activated.

23. The method of claim 22, further comprising activating the pull-up TFT in response to the state of the first node.

24. The method of claim 23, wherein activating the pull-up TFT comprises deactivating the first and second pull-down TFTs.

25. The method of claim 22, further comprising:

applying a high state to the second node and maintaining a low state at the third node, applying a high state to the third node and maintaining a low state at the second node, and applying a high state to the first node and maintaining a low state at the second and third nodes.

* * * * *

UNITED STATES PATENT AND TRADEMARK OFFICE
CERTIFICATE OF CORRECTION

PATENT NO.         : 7,595,783 B2                                          Page 1 of 1
APPLICATION NO.    : 11/295976
DATED              : September 29, 2009
INVENTOR(S)        : Cho et al.

It is certified that error appears in the above-identified patent and that said Letters Patent is hereby corrected as shown below:

On the cover page,

[*] Notice:    Subject to any disclaimer, the term of this patent is extended or adjusted under 35 USC 154(b) by 679 days Delete the phrase "by 679 days" and insert -- by 966 days --

Signed and Sealed this

Fifteenth Day of June, 2010

David J. Kappos
*Director of the United States Patent and Trademark Office*